(12) United States Patent
Holm et al.

(10) Patent No.: US 7,767,266 B2
(45) Date of Patent: Aug. 3, 2010

(54) JETTING DEVICE AND METHOD AT A JETTING DEVICE

(75) Inventors: William Holm, Älvsjö (SE); Kenth Nilsson, Åkersberga (SE); Johan Berg, Uppsala (SE); Johan Kronstedt, Sollentuna (SE); Håkan Sandell, Täby (SE)

(73) Assignee: Mydata Automation AB, Broma (SE)

( * ) Notice: Subject to any disclaimer, the term of this patent is extended or adjusted under 35 U.S.C. 154(b) by 997 days.

(21) Appl. No.: 10/521,566

(22) PCT Filed: Jun. 23, 2003

(86) PCT No.: PCT/SE03/01063

§ 371 (c)(1),
(2), (4) Date: Jan. 18, 2005

(87) PCT Pub. No.: WO2004/010753

PCT Pub. Date: Jan. 29, 2004

(65) Prior Publication Data

US 2005/0167519 A1    Aug. 4, 2005

(30) Foreign Application Priority Data

Jul. 18, 2002    (SE)    .................................... 0202247

(51) Int. Cl.
*B05D 1/02*    (2006.01)

(52) U.S. Cl. .................. 427/421.1; 222/14; 222/55; 222/56; 222/57; 222/596; 239/4; 239/13; 239/128; 239/133; 239/435; 417/322; 417/469; 118/211; 118/696; 347/6; 347/7; 347/15; 347/54

(58) Field of Classification Search .............. 427/421.1; 222/55–57, 71, 73
See application file for complete search history.

(56) References Cited

U.S. PATENT DOCUMENTS 4,266,232 A    5/1981    Juliana, Jr. et al.

(Continued)

FOREIGN PATENT DOCUMENTS

EP    0 855 277 A2    7/1998

(Continued)

OTHER PUBLICATIONS

E.P. Hofer, "Spot-Size Modulation in Drop-on-Demand Ink-Jet Technology", Technical University of Hamburg-Harburg, Hamburg, Federal Republic of Germany, pp. 321-322, SID 85 DIGEST, 1985.

*Primary Examiner*—Michael Cleveland
*Assistant Examiner*—Joel G Horning
(74) *Attorney, Agent, or Firm*—Birch, Stewart, Kolasch & Birch, LLP

(57) ABSTRACT

A method and a system for jetting droplets of viscous medium, such as solder paste, onto a substrate, such as an electronic circuit board. The volume of the droplets are adjusted by regulating the amount of viscous medium that is fed into a jetting nozzle for subsequent jetting of the viscous medium droplets therefrom. The exit velocity of the jetted droplets is adjusted or maintained substantially constant by regulating the velocity with which the viscous medium is impacted. Furthermore, the rate at which viscous medium is fed, for instance by a feed screw, into the nozzle is adjusted in order to regulate the feeding time required for feeding the viscous medium into the jetting nozzle, for instance in order to maintain a constant feeding time.

24 Claims, 9 Drawing Sheets

U.S. PATENT DOCUMENTS

| | | | |
|---|---|---|---|
| 5,320,250 A * | 6/1994 | La et al. | 222/1 |
| 5,495,270 A | 2/1996 | Burr et al. | |
| 5,581,286 A | 12/1996 | Hayes et al. | |
| 5,747,102 A | 5/1998 | Smith et al. | |
| 5,876,615 A | 3/1999 | Predetechensky | |
| 5,988,526 A * | 11/1999 | Tzeng et al. | 239/119 |
| 6,029,896 A | 2/2000 | Self et al. | |
| 6,126,263 A | 10/2000 | Hotomi et al. | |
| RE37,047 E * | 2/2001 | Py | 604/294 |
| 6,450,416 B1 * | 9/2002 | Berg et al. | 239/4 |
| 6,589,791 B1 * | 7/2003 | LaBudde et al. | 436/55 |
| 2002/0025260 A1 * | 2/2002 | Maruyama | 417/322 |
| 2002/0071772 A1 | 6/2002 | Isogai et al. | |

FOREIGN PATENT DOCUMENTS

| | | |
|---|---|---|
| EP | 0 976 558 A2 | 2/2000 |
| EP | 1 108 540 A1 | 6/2001 |
| JP | 2001046940 A | 2/2001 |
| JP | 2001-113212 | 4/2001 |
| JP | 2001217529 A | 8/2001 |
| WO | WO 95/11807 A1 | 5/1995 |
| WO | WO 99/64167 A1 | 12/1999 |
| WO | WO 00/61297 A1 | 10/2000 |
| WO | WO-02/32201 A1 | 4/2002 |
| WO | WO 02/089545 A1 | 11/2002 |
| WO | WO 03/051526 A1 | 6/2003 |

* cited by examiner

JETTING DEVICE AND METHOD AT A JETTING DEVICE

TECHNICAL FIELD OF THE INVENTION

The present invention generally relates to a method and a system for jetting droplets of viscous medium onto a substrate. In particular, the present invention relates to a method and a system for jetting droplets onto a substrate, in which the size of the resulting deposits on the substrate can be varied.

TECHNICAL BACKGROUND AND PRIOR ART

Systems, devices and methods are known in the art for jetting droplets of viscous medium, e.g. solder paste or glue, onto a substrate, e.g. an electronic circuit board, thus forming deposits on the substrate prior to mounting components thereon. Such a jetting system generally comprises an nozzle space for containing a small volume of the viscous medium prior to the jetting thereof, a jetting nozzle communicating with the nozzle space, an impacting device for impacting and jetting the viscous medium from the nozzle space through the jetting nozzle in the form of droplets, and a feeder for feeding the medium into the nozzle space.

Since the production speed is an essential factor in the manufacturing of electronic circuit boards, the application of viscous medium is preferably performed "on the fly", i.e. without stopping for each location on the substrate where viscous medium is to be deposited.

When applying solder paste or the like on a substrate, such as a circuit board, it has long been a requirement to have different sizes or areas for deposits on different locations of the substrate. When jetting is used, one solution is to apply several drops on top of each other, thus forming a larger deposit. It has also been suggested to vary the volume of the jetted droplet, thereby varying the size of the resulting deposit, by controlling the impact on the viscous medium.

SUMMARY OF THE INVENTION

An object of the present invention is to provide an alternative solution to the problem of varying the size of jetted deposits on a substrate.

For the purposes of this application, it is to be noted that the term "viscous medium" should be interpreted as solder paste, flux, adhesive, conductive adhesive, or any other kind of medium used for fastening components on a substrate, conductive ink, resistive paste, or the like; that the term "deposit" refers to a connected amount of viscous medium applied at a position on a substrate as a result of one or more jetted droplets; that the term "deposit size" mainly refers to the area on the substrate that a deposit will cover, but also that an increase in the droplet volume generally results in an increase also in the deposit height; and that the term "substrate" should be interpreted as a printed circuit board (PCB), a substrate for ball grid arrays (BGA), chip scale packages (CSP), quad flat packages (QFP), wafers, flip-chips, or the like.

It is also to be noted that the term "jetting" should be interpreted as a non-contact dispensing process that utilizes a fluid jet to form and shoot droplets of a viscous medium from a jet nozzle onto a substrate, as compared to a contact dispensing process, such as "fluid wetting."

According to one aspect, there is provided a method of jetting droplets of viscous medium onto a substrate. The method comprises the steps of providing a jetting nozzle comprising a nozzle space and a nozzle outlet, feeding said viscous medium into the nozzle space, impacting said viscous medium, thereby jetting viscous medium from the nozzle space in the form of droplets through the nozzle outlet towards the substrate. The step of feeding viscous medium comprises, prior to the jetting of each individual droplet, feeding a controlled amount of said viscous medium into the nozzle space, and varying the controlled amounts of said viscous medium in dependence of the desired specific volume of each individual droplet.

According to another aspect, there is provided a system for jetting droplets of viscous medium onto a substrate. The system comprises a jetting nozzle from which the droplets of viscous medium are jetted, wherein the jetting nozzle comprises a nozzle outlet facing the substrate, and wherein the interior of the jetting nozzle defines a nozzle space arranged to receive viscous medium to be jetted, a feeder for feeding viscous medium into said jetting nozzle, an impacting device for impacting said viscous medium, thereby producing jetting of viscous medium from the nozzle space in the form of droplets through the nozzle outlet towards the substrate, and a control unit arranged for controlling said feeder such that the amount of said viscous medium fed into the nozzle space for the subsequent jetting of droplets is varied in dependence of the desired specific volume of each individual droplet.

Thus, the invention is based on the advantageous idea of varying the volume of a droplet to be jetted by regulating the amount of viscous medium that is fed into a nozzle space, or other suitable chamber, for subsequent jetting of viscous medium droplets therefrom. Then, it has been found that viscous medium droplets of varying volume can be jetted without any adjustment or regulation of the impacting device or operation being required. Even when having the same impacting device acting in the same manner, i.e. with the same length, acceleration and velocity of the impacting stroke, the volume of jetted droplets may be varied. Thus, by regulating the amount of viscous medium present in the nozzle space when the viscous medium is impacted by the impacting device, the volume of the droplet and, hence, the desired deposit size can be selected with high precision.

The present invention presents a number of advantages in relation to the existing solutions of varying the size of deposits provided through jetting. Firstly, as compared to the solution of jetting several droplets onto the same location on the substrate, only one droplet has to be jetted for each deposit. Thus, the jetting can be performed "on the fly", i.e. without stopping for jetting additional droplets to the same location. Alternatively, the jetting system or device does not have to pass over the intended deposit location more than once for each droplet.

Furthermore, when jetting multiple droplets at the same location, there will have to be a compromise between small droplets, that will provide good flexibility in terms of volume alternatives, or large droplets, which will require a lesser number of droplets for very large deposits. Thus, using the present invention for applying viscous medium onto a substrate, a greater flexibility of droplet volume can be achieved and the time required for the viscous medium application can be significantly reduced, and, thus, the overall production speed can be increased.

Secondly, in comparison with the solution of controlling the impact on the viscous medium. According to the suggested solutions, this is performed by adapting the depth, i.e. the length of stroke, of the impact provided by an impacting device on the viscous medium. However, variations in the length of stroke also has effects on the exit velocity of the jetted droplets, i.e. the velocity a droplet has when it leaves the nozzle outlet. Thus, a change in the length of stroke in order to achieve a change in the droplet volume, will significantly change the exit velocity of the jetted droplet. In fact, studies have shown that the effects on the exit velocity is greater than the effects on the droplet volume.

When jetting "on the fly" there is relative movement between the jetting device and the substrate at the actual instant when a droplet is jetted. Then, the position that the jetting device has when the droplet is jetted must be carefully calculated, in relation to the relative speed between the nozzle and the substrate, the height between the nozzle and the substrate, i.e. the flight distance in the jetting direction, and the jetting or exit velocity, such that the resulting deposit ends up at the correct location on the substrate. As regards the jetting velocity, if it is too high, the droplet will split into a plurality of smaller droplets when hitting the board, and if the velocity is too low, the accuracy of the positioning will be decreased.

Thus, a close control of the exit velocity is of significant importance in order for the correct jetting instant or position to be precisely calculated. As a consequence thereof, significant variations in the exit velocity has a detrimental effect on the quality of the jetting result. If the relative movement between the substrate and the jetting device is slowed down, then the effects of exit velocity variations may be reduced. However, this would of course increase the time required for the application of viscous medium. Thus, the present invention provides for jetting of viscous medium with an improved quality of the jetting result and/or an increased production speed as compared to known solutions of controlling the impact on the viscous medium.

According to the present invention, the jetting system comprises a feeder for feeding viscous medium towards a jetting nozzle, from where droplets of viscous medium may be jetted. The jetting system further comprises an impacting device for impacting viscous medium fed by the feeder, such that droplets of viscous medium are jetted through the nozzle towards a substrate. Following an impact on the viscous medium, the impacting device is preferably immediately returned to a position ready for impact, so as to not interfere with the feeding of viscous medium for the droplet to be subsequently jetted.

The jetting nozzle, in turn, comprises a nozzle outlet through which the droplets are jetted towards the substrate, said nozzle outlet being located at one end of the nozzle. The end portion of the nozzle where the nozzle outlet is located will below be referred to as the lower portion of the nozzle, even though the system of course may be oriented for jetting droplets in any direction, not only downwards. Furthermore, the nozzle has surrounding inner walls defining a nozzle space, which is in open communication with the nozzle outlet. The portion of the nozzle opposite the nozzle outlet, referred to below as the upper portion of the nozzle, is arranged for receiving viscous medium supplied by the feeder.

According to the invention, the nozzle space is filled with viscous medium to a varying degree prior to the jetting of individual droplets, the degree being adjusted in dependence on the volume of the droplet to be jetted, which in turn is dependent on the desired size of the deposit. For the largest droplet volume, the entire nozzle space is filled with viscous medium.

Preferably, the filling of the nozzle space is performed from the upper portion towards the nozzle outlet. In other words, when the nozzle space is partially filled with viscous medium, the lower portion of the nozzle space is free of viscous medium, see the detailed description below with reference to the figures. Thus, an essentially void free amount of viscous medium extends from the nozzle outlet to and through the feeder.

Moreover, the nozzle is preferably configured such that the nozzle space, or at least a substantial portion thereof, is tapered in the direction towards the nozzle outlet, said taper even more preferably having a conical, or rather a frusto-conical, configuration.

According to preferred embodiments of the invention, the feeding rate, i.e. the rate with which the viscous medium is supplied to the jetting nozzle by the feeder, is adjustable. Thereby, the time required for feeding the appropriate amount of viscous medium into the nozzle space for jetting of a droplet of a desired volume can be regulated. This means that the time required for feeding the appropriate amount into the nozzle space can be maintained at an essentially constant level, irrespective of the amount and, hence, the desired droplet volume, and the corresponding jetting sequence can be maintained at a constant frequency, if desired. Furthermore, the feeding rate and, hence, the time required for feeding the appropriate amount, can be adjusted to accommodate different jetting frequencies.

According to an exemplary embodiment, varying the controlled amount of viscous medium that is fed to the nozzle space for the jetting of a droplet is obtained by varying the duration of the feeding action, i.e. the time period during which the feeder feeds viscous medium into the nozzle space. Then, the feeding rate may be kept essentially constant.

It should be noted that the feeding rate affects the feeding pressure, i.e. the pressure experienced by the viscous medium that urges the viscous medium forward in the feeding direction. Thus, the feeding pressure regulates the rate at which the viscous medium flows into the nozzle space. When jetting shall be provided at a higher frequency for a particular droplet volume, the time required for feeding the appropriate amount into the nozzle space has to be reduced. Thus, a desired increase in jetting frequency without changing the droplet volume requires an increase in the feeding pressure, and vice versa. Correspondingly, a desired increase in the droplet volume without changing the jetting frequency requires an increase in the feeding pressure.

Also, according to preferred embodiments of the invention, the jetting system further comprises a jetting chamber, located between the jetting nozzle and the feeder and in open communication with the upper portion of the nozzle space. Thus, when the feeder supplies viscous medium to the nozzle space, the viscous medium is supplied via the jetting chamber. According to this embodiment, the actual jetting is provided by having an end surface of the impacting device impacting the viscous medium in the jetting chamber. As a result, the impacting effect propagates through the viscous medium in the jetting chamber, and brings viscous medium contained in the nozzle space to be jetted through the nozzle outlet onto the substrate. Then, it has been found that the volume of the jetted viscous medium droplet essentially corresponds to the volume of viscous medium contained in the nozzle space. Thus, by regulating the amount of viscous medium present in the nozzle space when the viscous medium is impacted by the impacting device, the volume of the droplet and, hence the desired deposit size can be selected with high precision.

One problem frequently encountered within the art is to provide a reproducibly accurate droplet size. In particular, the first droplet or droplets jetted in a jetting sequence, i.e. following a pause prior to said jetting sequence, tend(s) to have a different size as compared to the following droplets in the ensuing jetting sequence, or to the intended droplet size. The duration of a pause that will have a negative impact on the accuracy of the volume of the subsequent first droplet(s) is dependent on the above-mentioned feeding pressure. Thus, if the feeding pressure prior to and following the pause is low, the time required for a pause to have such negative effects on the droplet volume accuracy that it needs to be compensated for is longer than if said feeding pressure is high.

According to preferred embodiments of the invention, the above-stated problem is solved by providing a feeding pressure prior to the jetting of the first drop following a pause that corresponds to the feeding pressure at the jetting of successive droplets within a jetting sequence, i.e. so late in the jetting sequence that the problems of the first droplet(s) are not encountered. According to these embodiments, the feeder is activated during said pause such that viscous medium is fed into the nozzle space and fills the nozzle space entirely. When the nozzle space has been filled, any excess viscous medium, i.e. viscous medium fed into the nozzle space in excess of what said space may accommodate, flows out of the nozzle outlet. Prior to the feeding into the nozzle space of the amount of viscous medium required for jetting a droplet of a desired volume, the amount of viscous medium present in the nozzle space is reduced by a preset amount, such that the amount of viscous medium present in the nozzle space after said reduction is at a predetermined or preset degree.

Preferably, the time when the feeder is activated for filling the nozzle space during a pause, i.e. the time period prior to initiating the jetting of the first droplet after the pause, is carefully selected so as to ensure filling of the entire nozzle space, while simultaneously reducing the undesired flow of excess viscous medium through the nozzle outlet as much as possible. Said time period is preferably calculated in relation to the chosen feeding rate and corresponding feeding pressure.

According to an embodiment of the invention, the feeding rate prior to jetting of the first droplet of a jetting sequence differs in relation to the feeding rate during the ensuing jetting of the consecutive droplets within the sequence. Preferably, the feeding rate prior to jetting of the first droplet is increased. This naturally entails that the duration of the feeding action while still obtaining the desired feeding pressure may be reduced, and the time period required for pre-filling of the nozzle space for jetting of the first droplet can be shortened.

However, it has also surprisingly been shown that by increasing the feeding rate, and reducing the feeding duration such that the desired feeding pressure for jetting of the first droplet is still obtained, the undesired flow of excess viscous medium out of the nozzle space is reduced.

According to a preferred embodiment of the invention, any excess viscous medium that may flow out of the nozzle outlet when filling the nozzle space during said pause is removed. This embodiment will be further described below.

For the embodiments where a jetting chamber is provided between the nozzle and the feeder, said reduction is provided by increasing or expanding the volume of the jetting chamber. Thus, due to the open communication with the jetting chamber and the fact that the jetting chamber and nozzle space is entirely filled with viscous medium, i.e. in an essentially void-free condition, an amount of viscous medium corresponding to the expansion is withdrawn or retracted into the jetting chamber. Thus, the volume present in the nozzle space immediately following said expansion may be accurately predicted or predetermined. Then, jetting is resumed by feeding the appropriate amount of viscous medium into the nozzle space and impacting viscous medium in the manner described above.

Preferably, a wall of the jetting chamber located opposite the jetting nozzle is constituted by an impact end surface of the impacting device, said end surface preferably being circular. Thus, the impact end surface of the impacting device defines one wall of the jetting chamber. In connection with the filling of the nozzle space during a pause and in preparation for the jetting of the first droplet(s) following the pause, the impact end surface is brought or has been brought into an idle position. This can be performed by rapidly bringing the end surface into the idle position immediately following the jetting of the last droplet prior to the pause, i.e. when the nozzle space preferably is substantially free of viscous medium. According to another example, the end surface is brought to an idle position slowly so as to avoid any inadvertent jetting of viscous medium that might be present in the nozzle space.

Following the movement of the end surface into an idle position, the expansion of the jetting chamber may be provided by moving the end surface of the impacting device in a direction away from the nozzle from said idle position into a position ready for impacting. Thus, the expansion of the jetting chamber, and the resulting retraction of viscous medium from the nozzle space, may be provided without the need for additional means or elements for expanding the jetting chamber.

What has been explained above about bringing the impacting device into an idle position thus includes the alternative of moving the impacting device into the idle position immediately after jetting the last droplet prior to the pause, i.e. so that the impacting device will have no time to retract to the position ready for impacting, and the alternative of first moving the impacting device to the position where it is ready to impact, then moving it into the idle position.

Another variable affecting the accuracy of the jetting and, hence, the quality of the viscous medium provided on substrate, is the velocity with which the droplets are jetted onto the substrate. Studies have shown that when amending the droplet volume, the exit velocity of the jetted droplet is affected. According to preferred embodiments of the present invention, the exit velocity of the jetted droplet is controlled by amending the impacting characteristics of the impacting device. Preferably, this is provided by regulating the impact velocity or impact force of the impacting device such that a predetermined exit velocity can be maintained irrespective of the volume of the droplet to be jetted. Then, it has been found that a droplet of smaller volume has a lower exit velocity as compared to a droplet of larger volume. Thus, the impact velocity or impact force is preferably increased for a droplet of smaller volume and decreased for a droplet of larger volume.

As evident to a person skilled in the art, there are a number of choices of different impacting devices that may be used to accomplish jetting of droplets, such as a magnetostrictive, electrostrictive or electromagnetic actuator, or an actuator having shape memory alloy properties. However, according to preferred embodiments of the invention, a piezoelectric actuator is used. Then, the above mentioned regulation of the impact velocity or force is accomplished by regulating the voltage applied to the piezoelectric actuator.

Even though a number of different means or devices for feeding viscous medium are conceivable within the scope of this invention, such as a pneumatic device, gear-driven pumps, piston pumps, etc., according to preferred embodiments of the invention, said feeder is provided in the form of a rotatable feed screw. Such a feed screw for feeding viscous medium to a jetting chamber or to a jetting nozzle in a jetting system is disclosed in WO 99/64167, which is incorporated herein by reference. A further example is disclosed in WO 03/051526, which also is incorporated herein by reference.

The use of such a rotatable feed screw makes it possible to control the feeding of viscous medium to the nozzle space in an advantageously accurate, rapid and simple manner. Rotational movement of the rotatable feed screw will immediately affect the behavior of the viscous medium at the output end of the rotatable feed screw near the nozzle space, as compared to the use of a pressure device for supplying viscous medium to a jetting nozzle, which will cause an effect at the jetting nozzle only after a certain time delay, which is given by the time it takes for a pressure wave to travel through the medium from the pressure device to the nozzle. Furthermore, by placing the feeding outlet of the feed screw in close proximity to the jetting nozzle or jetting chamber, the volume in which the compressibility of the viscous medium may have a negative effect on the accuracy of the feeding control is considerably decreased, thus limiting the negative effects concerning the difficulty to accurately control the feeding operation caused by said compressibility.

According to further preferred embodiments of the invention, there is provided a device for removing viscous medium from the nozzle outlet. Thereby, viscous medium residue that might have become attached to the nozzle outlet is removed. Thus, the problem of viscous medium residue interfering with the jetted droplet so as to alter the volume of the droplet, e.g. a volume of viscous medium residue situated at the nozzle outlet may loosen from the surface and instead adhere to and be incorporated into the jetted droplet, is effectively avoided. Furthermore, there is no risk of viscous medium residue causing spattering of viscous medium when a jetted droplet "collides" with the residue. For the embodiment where excess viscous medium may flow out of the nozzle outlet when filling the nozzle space during a pause, the excess viscous medium is also removed from the nozzle outlet by the provided removing device.

Preferably, according to an embodiment of the present invention, a gaseous flow is provided past the nozzle outlet, the magnitude and the velocity of the gaseous flow being sufficient for transporting viscous medium away from the area at the nozzle outlet with the gaseous flow. The provision of such a gaseous flow at a jetting system is disclosed in co-pending International patent application PCT/SE02/00807, which is incorporated herein by reference.

The provision of a gaseous flow during the jetting of droplets provides a number of advantages. First, any viscous medium residue that has become attached to the nozzle outlet surfaces following the jetting of a droplet is immediately transported away from the vicinity of the nozzle outlet. Second, the gaseous flow can pick up and transport away from the nozzle outlet minute quantities of viscous medium that have broken off from the droplet or jet and that would otherwise adhere to the surfaces of the nozzle outlet as residue. Thus, the build-up or accumulation of viscous medium residue at the nozzle outlet to an adverse amount is prevented. Furthermore, the gaseous flow will also transport the above mentioned excess viscous medium away from the nozzle outlet.

Preferably, the gaseous flow is generated by a suction generator, i.e. in the form of a vacuum ejector or any other suitable type of suction generator. Said suction generator then being provided downstream of the area surrounding the nozzle outlet, as seen in the direction of the gaseous flow.

Furthermore, according to exemplifying embodiments, the jetting system is provided with a wall, the wall being spaced apart from the nozzle outlet and located downstream of the nozzle outlet seen in the direction of the jetted droplets at the nozzle outlet. Said wall may, as an example, constitute part of a nozzle support, but can be provided without having any supporting function for the nozzle. Between the wall and the nozzle outlet, there is formed a space acting as a channel or guide for the gaseous flow at and past the nozzle outlet. Since said wall is located in the jetting path, the wall is provided with an opening or orifice, concentric with the nozzle outlet. The jetted droplets are thereby permitted to pass through the wall via the orifice. Preferably, the orifice of the wall also functions as an inlet for the gaseous flow towards the nozzle outlet.

According to exemplifying embodiments of the invention, the jetting system is comprised in a jetting assembly, which is releasably mountable in a machine that uses the assembly for providing a substrate with viscous medium deposits. Such an assembly cassette is disclosed in WO 00/61297, which is incorporated herein by reference.

By being releasably mountable in the machine, the assembly may be used as a separate unit that is easily exchangeable and contains the viscous medium. Apart from the obvious utilization of exchanging the assembly when the viscous medium runs out, the assembly can further be dimensioned to be particularly suitable for applying droplets within a certain volume range. It should be noted, that in order to provide an increase in the deposit diameter by a factor of 2, the increase in the droplet volume will probably have to be increased by a factor of between 4 to 8 depending on how much the deposit height will be affected by the volume increase. Thus, for instance, if viscous medium deposits varying in size from a diameter of 0.25 mm up to 0.8 mm are to be provided on a substrate, one assembly may be provided for supplying the substrate with deposits having diameters in the range of 0.25-0.5 mm, and an other assembly may be provided for deposits having diameters in the range of 0.4-0.8 mm.

Further objects and advantages of the present invention will be discussed below by means of exemplifying embodiments.

BRIEF DESCRIPTION OF THE DRAWINGS

Preferred embodiments of the invention will now be described in greater detail with reference to the accompanying drawings, in which.

DESCRIPTION OF PREFERRED EMBODIMENTS

Figure 1:
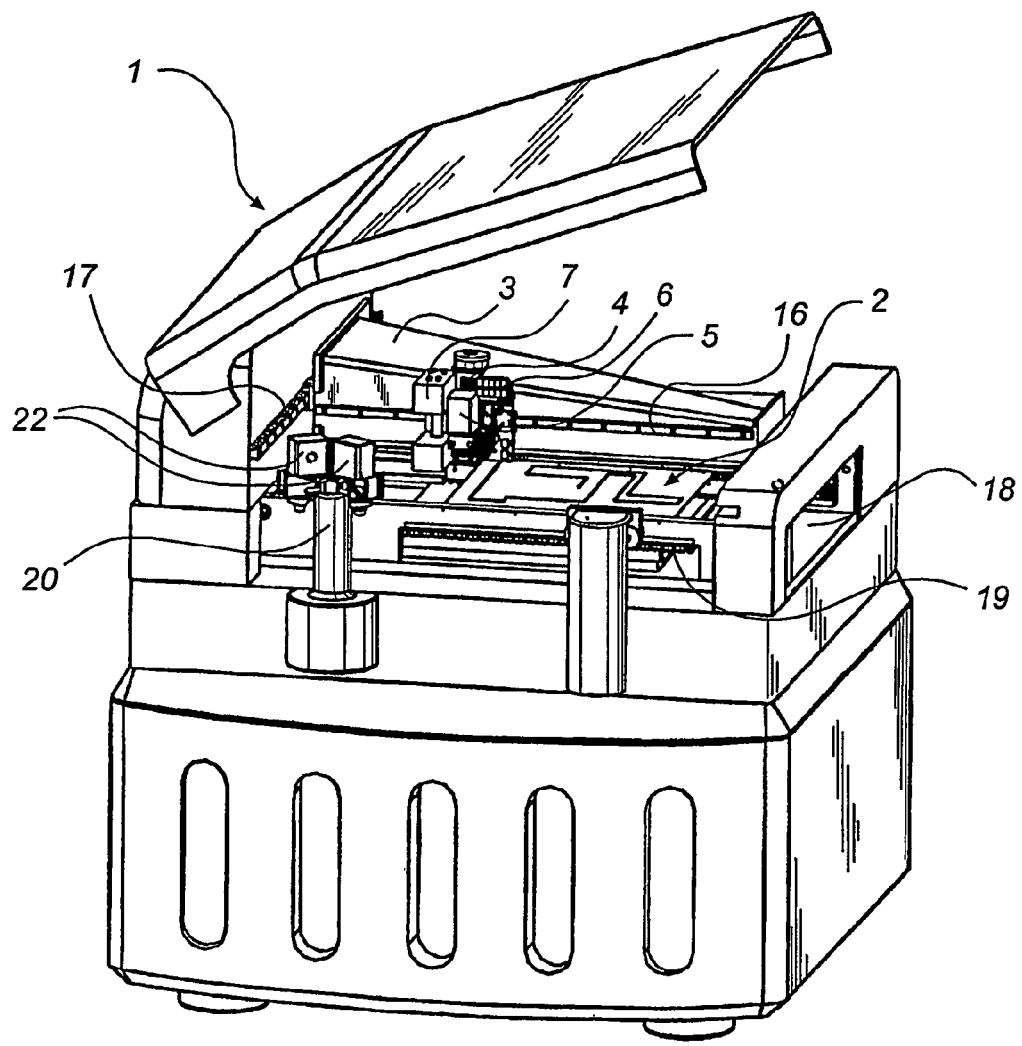
FIG. 1 is a perspective view showing the general outline of a machine for application of solder paste comprising a system for jetting according to the present invention.

FIG. 1 illustrates an embodiment of a machine 1 for providing a substrate 2 with deposits by jetting droplets of a viscous medium onto the substrate 2, in accordance with the present invention. For ease of description, it is assumed that the viscous medium is solder paste, which is one alternative as defined above. For the same reason, the substrate 2 will be referred to as an electric circuit board and the gas of the gaseous flow discussed above will be referred to as air. In this embodiment the machine 1 is of a type comprising an X-beam 3 and an X-wagon 4 connected with the X-beam 3 via an X-rail 16 and reciprocatingly movable along the X-rail 16. The X-beam, in turn, is reciprocatingly movably connected with a Y-rail 17, thereby being movable perpendicularly to the X-rail 16. The Y-rail 17 is rigidly mounted in the machine 1. Generally, the movements are driven by linear motors (not shown).

Furthermore, the machine 1 comprises a conveyor 18 for carrying the substrate 2 through the machine 1, and a locking device 19 for locking the substrate 2 when jetting is to take place.

A docking device 8 is connected to the X-wagon 4 for enabling releasable mounting of an assembly 5 at the docking device 8. The assembly 5 is arranged for dispensing droplets of solder paste, i.e. jetting, which impact and form deposits on the board 2.

The machine 1 also comprises an exchange assembly support 20, supporting further assemblies 22, which may be substituted for the assembly 5 currently carried by the docking device 8.

Furthermore, the machine 1 comprises a machine vision device 7, which in this embodiment is a camera. The camera 7 is used for determining the position and rotation of the substrate 2 and for checking the result of the dispensing process by viewing the deposits.

Additionally, the jetting machine 1 comprises a suction generator, here in the form of a vacuum ejector 6, arranged on the X-wagon 4, and a source of compressed air (not shown). The vacuum ejector 6, as well as the source of compressed air, is in communication with the docking device 8 via an air conduit interface which is connectable to a complementary air conduit interface, in this embodiment indicated as input nipples 9, see FIG. 2, of the docking device 8.

As understood by those skilled in the art, the jetting machine comprises a control unit (not explicitly shown) for executing software running the machine.

Briefly, the jetting machine works as follows. The board 2 is fed into the jetting machine 1 by means of the conveyor 18, upon which the board 2 is placed. When the board 2 is in the correct position under the X-wagon 4, the board 2 is fixed with the aid of the locking device 19. By means of the camera 7, fiducial markers are located, which markers are prearranged on the surface of the board 2 and used to determine the precise position thereof. Then, by moving the X-wagon over the board 2 in a predetermined (pre-programmed) pattern and operating the jetting assembly 5 at predetermined locations, solder paste is applied on the board 2 at the desired locations.

Figure 2:
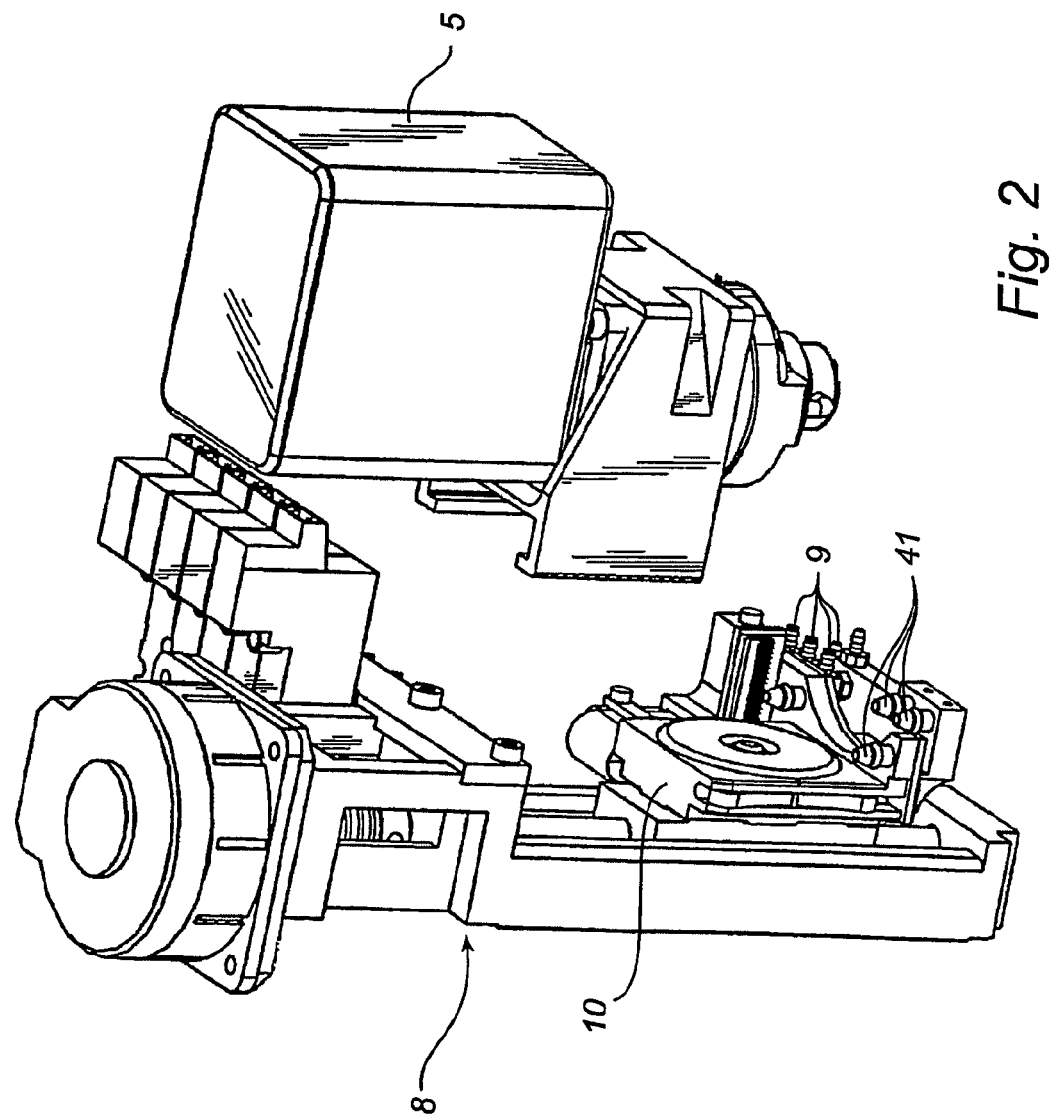
FIG. 2 is a schematic view from above of an embodiment of a docking device and a jetting assembly of the present invention.
Figure 3:
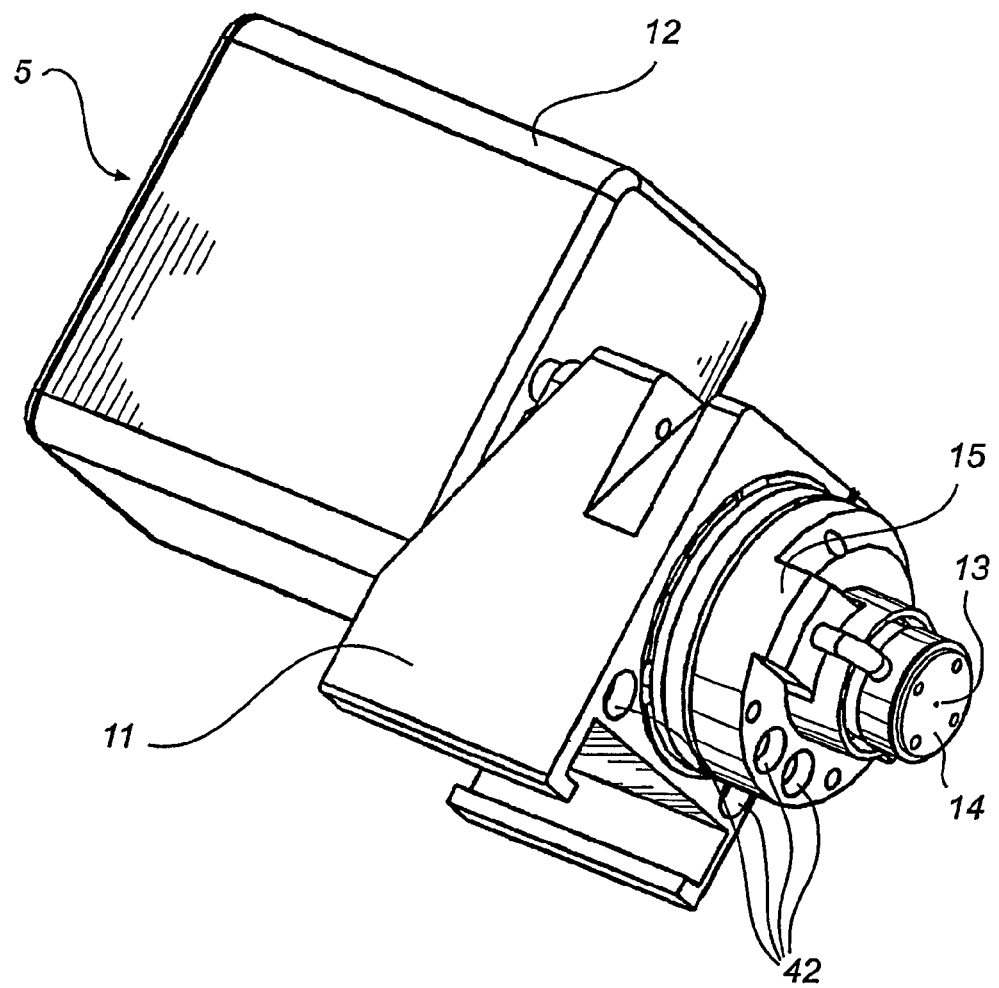
FIG. 3 is a schematic view showing the underside of the assembly shown in FIG. 2.

With reference to FIGS. 2-3, an embodiment of the jetting assembly 5, in accordance with the present invention, will now be described in more detail. The jetting assembly comprises an assembly holder 11, said holder 11 being arranged for connecting the jetting assembly 5 to an assembly support 10 of the docking device, see FIG. 2. Furthermore, in this embodiment the jetting assembly 5 comprises a supply container 12 providing a supply of solder paste, and an assembly housing 15. The jetting assembly 5 is connected to the vacuum ejector 6 and the source of pressurized air via a pneumatic interface comprising inlets 42, positioned to interface in airtight engagement with a complementary pneumatic interface comprising outlets 41, of the docking device 10. The outlets 41, in turn, are connected, via internal conduits of the docking device 8, to the inlet nipples 9 described above.

Figure 4:
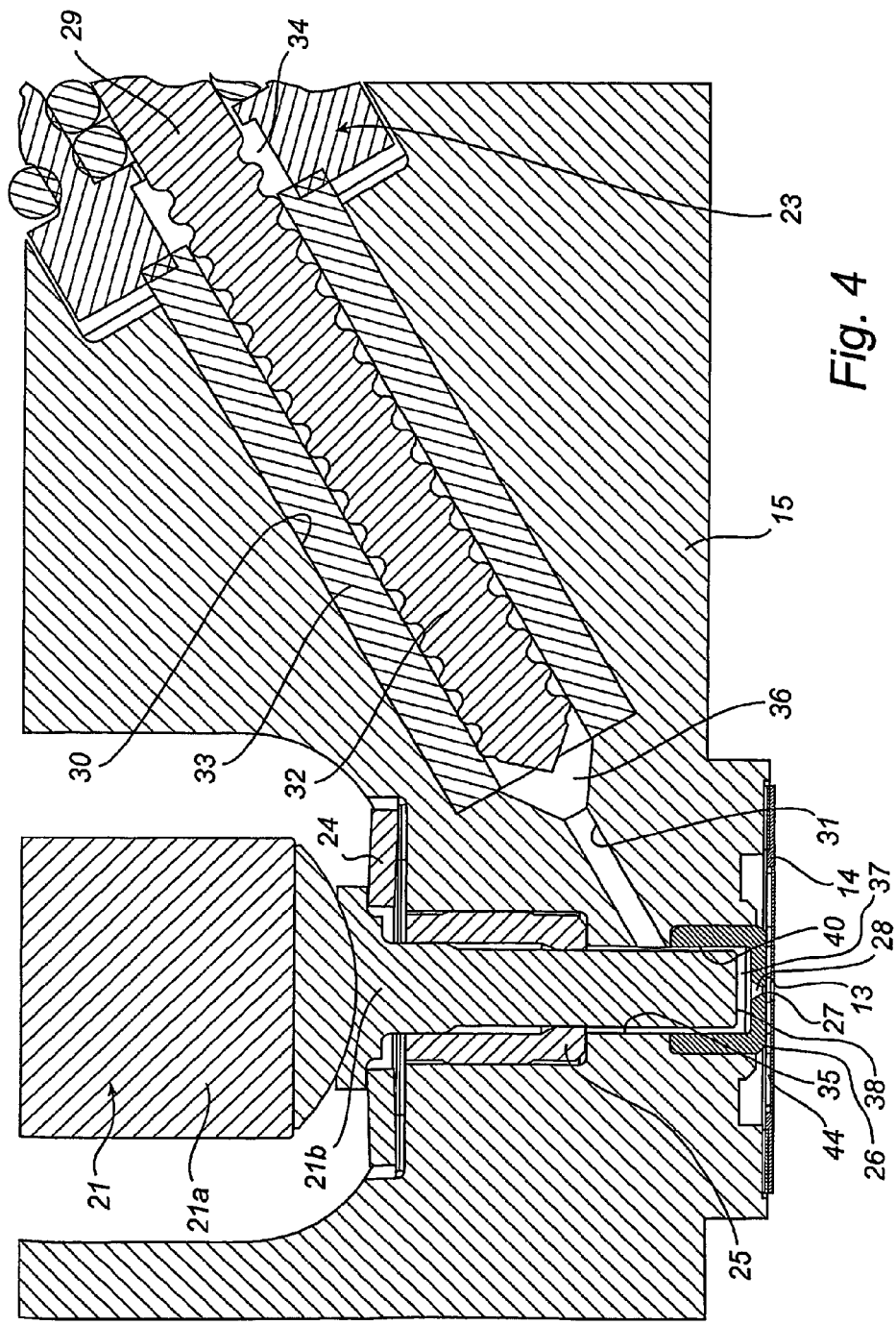
FIG. 4 is a schematic view showing a cut away portion of the assembly shown in FIG. 2.

With reference now to FIG. 4, the contents and function of the parts enclosed in the assembly housing 15 will be explained in greater detail. As can be seen in FIG. 4, the jetting assembly 5 comprises an impacting device, which in this embodiment constitutes a piezoelectric actuator 21 comprising a number of thin, piezoelectric elements stacked together to form an actuator part 21a. One, upper, end of the actuator part 21a is rigidly connected to the assembly housing 15. The assembly further comprises a bushing 25 rigidly connected to the assembly housing 15. The impacting device further comprises a plunger 21b, which is rigidly connected to the other, lower, end of the actuator part 21a. The plunger 21b is axially movable while slidably extending through a bore in the bushing 25. Cup springs 24 are provided to resiliently balance the plunger 21b against the assembly housing 15, and for providing a preload for the actuator part 21a. An eject control unit (not shown) applies a drive voltage intermittently to the piezoelectric actuator 21, thereby causing an intermittent extension thereof, and hence a reciprocating movement of the plunger 21b with respect to the assembly housing 15, in accordance with solder pattern printing data.

Figure 8:
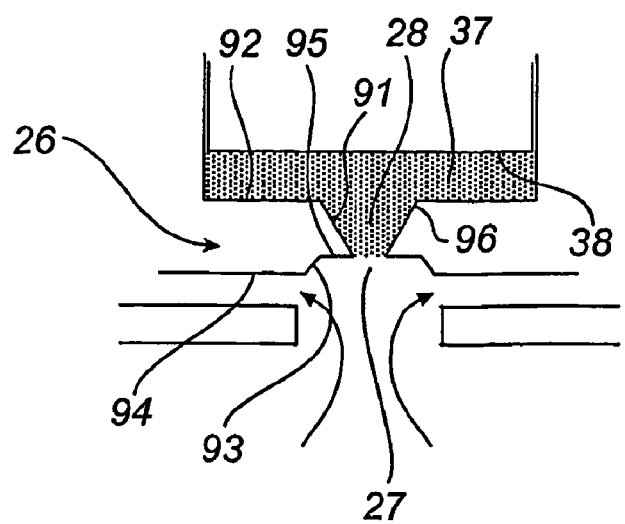
FIG. 8 is a schematic view of an embodiment of a nozzle according to the present invention.

Furthermore, the assembly comprises an essentially plate shaped jetting nozzle 26 operatively directed against the board 2, onto which small droplets of solder paste are to be jetted. In the jetting nozzle 26, there is provided a through hole defined by a first frusto-conical portion 91, see FIG. 8, extending from a top surface 92 of the nozzle 26 and downwards through most of the thickness of the nozzle 26, and a second frusto-conical portion 93 extending upwards from a bottom surface 94 of the nozzle 26 to the plane of the top of the first frusto-conical portion 91. Thus, the tops of the frusto-conical portions 91, 93 are directed towards each other. However, the diameter of the top of the second frusto-conical portion 93 is larger than the diameter of the top of the first frusto-conical portion, and therefore they are connected by a ring portion 95, which is in parallel with the top and bottom surfaces 92, 94 of the nozzle 26. The top of the first frusto-conical portion 91 defines a nozzle outlet 27 through which the droplets are jetted towards the board 2. Furthermore, a nozzle space 28 is defined by the first frusto-conical portion 91, i.e. by the inner walls thereof. Thus, the nozzle outlet 27 is located at one end, a lower portion 95, of the nozzle 26, see FIG. 8. The other end, an upper portion 96, of the nozzle 26, i.e. the base of the first frusto-conical portion 91, is arranged for receiving viscous medium, which is forced through the nozzle space 28 and out of the nozzle outlet 27.

The plunger 21b comprises a piston portion which is slidably and axially movably extending through a piston bore 35, an impact end surface 38 of said piston portion of the plunger 21b being arranged close to said nozzle 26.

A jetting chamber 37 is defined by the end surface 38 of said plunger 21b, the cylindrical inner wall of the nozzle 26, the upper surface 92 of the nozzle 26, which upper surface 92 is positioned opposite to the impact end surface 38, and the upper end 96 of the nozzle space 28. Thus, the jetting chamber 37 is in open communication with the upper portion of the nozzle space 28. Axial movement of the plunger 21b towards the nozzle 26, said movement being caused by the intermittent extension of the piezoelectric actuator 21, will cause a rapid decrease in the volume of the jetting chamber 37, and thus a rapid pressurization and jetting through the nozzle outlet 27, of any solder paste contained in the nozzle space 28.

Solder paste is supplied to the jetting chamber 37 from the supply container 12, see FIG. 3, via a feeder 23. The feeder comprises an electric motor (not shown) having a motor shaft 29 partly provided in a tubular bore 30, which extends through the assembly housing 15 to an outlet port 36. The outlet port 36 communicates with the jetting chamber 37 via a tubular bore 31, provided in the housing 15, and an annular space formed between the piston portion of the plunger 21*b* and a cylindrical inner wall provided by the piston bore 35 and the upper cylindrical inner wall 40 of the nozzle 26, respectively, said annular space extending from the outlet of the tubular port 31 down to the jetting chamber 37.

An end portion of the motor shaft 29 forms a rotatable feed screw 32 which is provided in, and coaxial with, the tubular bore 30, and which ends at the outlet port 36. An essential portion of the rotatable feed screw 32 is surrounded by a tube 33, made of an elastomer or the like, arranged coaxially therewith in the tubular bore 30, the threads of the rotatable feed screw 32 making sliding contact with the innermost surface of the tube 33. An alternative to the tube is an array of resilient, elastomeric O-rings.

The pressurized air obtained from the above-mentioned source of pressurized air (not shown) is arranged to apply a pressure on the solder paste contained in the supply container 12, thereby feeding said solder paste to an inlet port 34, provided at the beginning, or upper end of, the threads of the feed screw 32. An electronic control signal provided by a supply control unit (not shown) to the motor causes the motor shaft 29, and thus the rotatable feed screw 32, to rotate a desired angle, or at a desired rotational speed. Solder paste captured between the threads of the rotatable feed screw 32 and the inner surface of the o-rings 33 are then made to travel from the inlet port 34 to the nozzle space 28 via the outlet port 36, the tubular bore 31, the annular space, and the jetting chamber 37, in accordance with the rotational movement of the motor shaft 29.

As shown in FIGS. 3 and 4, a plate, or wall, 14 is arranged below, or downstream, of the nozzle outlet 27, as seen in the jetting direction. The plate 14 is provided with a through hole 13, through which the jetted droplets may pass without being hindered or negatively affected by the plate 14. Consequently, the hole 13 is concentric with the nozzle outlet 27. The plate 14 is spaced apart from the nozzle outlet 27. Between the plate 14 and the nozzle outlet 27, there is formed an air flow chamber 44, which is a space acting as a channel or guide that is connected with the vacuum ejector 6 for generating an air flow, illustrated, for example, by the arrows of FIG. 8, at and past the nozzle outlet 27. In this embodiment, the air flow chamber 44 is disc shaped. In this embodiment, the hole 13 acts as an inlet for the air flow towards and past the nozzle outlet 27.

Figure 5:
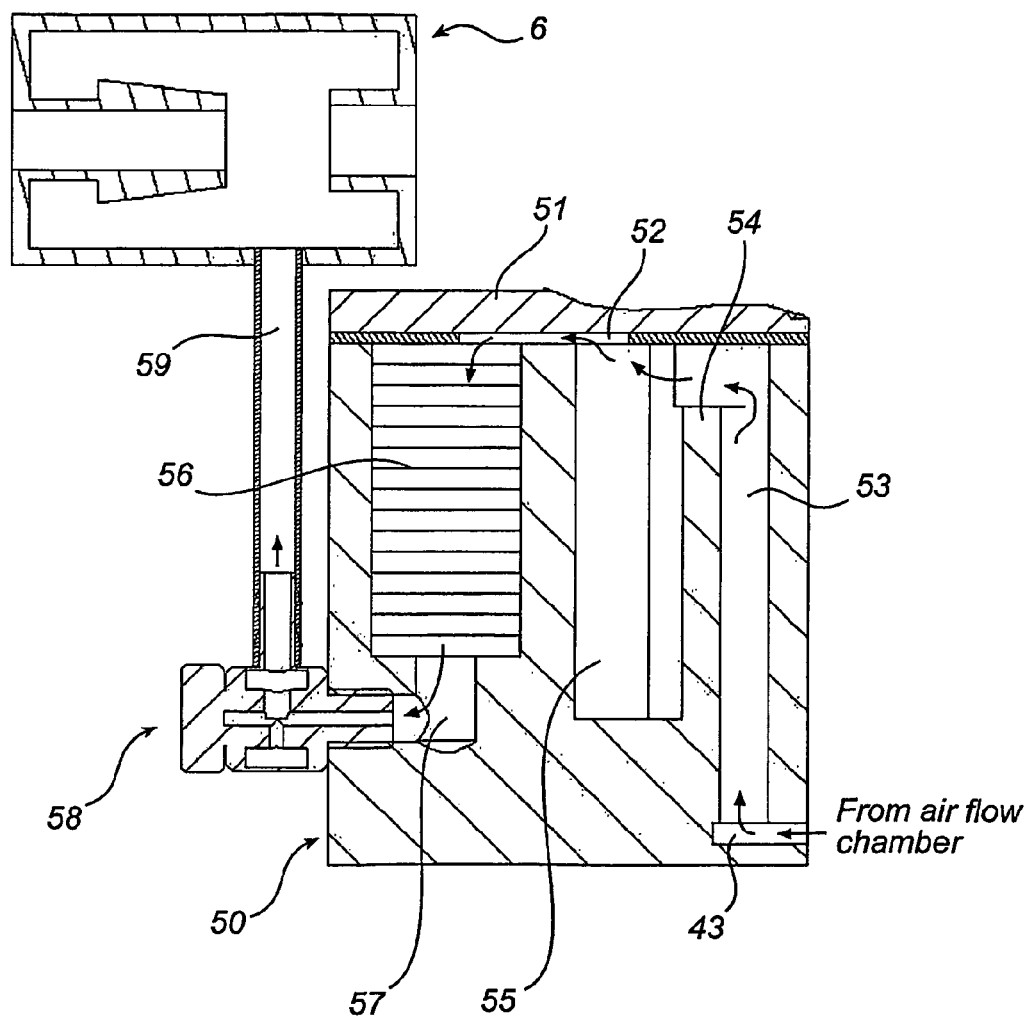
FIG. 5 is a schematic view of an embodiment of a waste container according to the present invention.

An air flow conduit 43 extends between the air flow chamber 44 and a waste container 50, see FIG. 5, which is arranged in the flow path from the air flow chamber 44 and the vacuum ejector 6. The air flow conduit 43 is not visible in FIG. 4 since it extends out of the plane of the paper. The waste container 50 is releasably connected to the jetting assembly 5 and collects fragments of residue solder paste originating from the nozzle outlet 27, as will be described in detail below. The waste container 50 is connected to the jetting assembly 5 at an interface on the jetting assembly 5, via a corresponding interface arranged on said waste container 50. The waste container 50 provides an interface and communication between the jetting assembly 5 and the vacuum ejector 6. Thereby, the negative pressure or vacuum produced by the vacuum ejector 6 is conveyed to the jetting assembly 5, and to the communicating air flow conduit 43 and air flow chamber 44.

The waste container 50 comprises an air conduit 53, which extends from said connecting interface. The air conduit 53 communicates with a collection space 55 over a separating wall 54, the collection space being arranged for collection of solder paste residue removed from the nozzle outlet 27.

At the top of the collection chamber 55, a narrow air conduit 52 leads the air flow from the collection chamber 55 into a filter 56. The filter 56 is of a conventional type and is provided for preventing any fragments of solder paste not collected in the collection chamber 55 from reaching the vacuum ejector 6. The filter 56 is further in communication with an outlet conduit 57.

The waste container 50 is releasably connected to the vacuum ejector 6, which is of a conventional type, for evacuating the waste container 50. The vacuum ejector 6 is connected to the waste container 50 via the air outlet 57, a connector 58 and an air tube 59. Even though the vacuum ejector is illustrated as being separate from the jetting assembly 5 and/or the waste container 50, a number of other placements or combinations of the vacuum ejector 6, the jetting assembly 5, and the waste container 50 are of course conceivable within the scope of the present invention.

In operation, the vacuum ejector 6 evacuates the waste container 50. This evacuation produces an air flow through the waste container as indicated by the arrows in FIG. 5. As a consequence, the air flow conduit 43 and the air flow chamber 44 of the jetting assembly 5 are also evacuated via the interface. Thus, air is sucked in through the outlet hole 13, which gives rise to a strong air flow in a direction reverse to that of the jetted droplets. This air flow will pass the nozzle outlet 27 and remove any undesired residue of solder paste that may have become adhered to the nozzle outlet, for reasons described above.

According to this embodiment of the invention, the air flow is provided before, during and after the jetting of each droplet. However, if more appropriate, the air flow could be provided intermittently. The air flow path is constructed such that, due to the force of the air flow, solder paste fragments removed from the vicinity of the jetting outlet will be carried along into the collection chamber, where they, or at least a majority thereof, will fall down due to the gravity force. Any residue of solder paste that continues along with the air flow into the narrow conduit 52, will be collected by the filter 56.

The support plate 14 may alternatively comprise one or more additional hole(s). Naturally, the positioning and design of the other hole(s) must be such that a forceful flow of air is provided at or past the nozzle outlet 27.

Figure 6A:
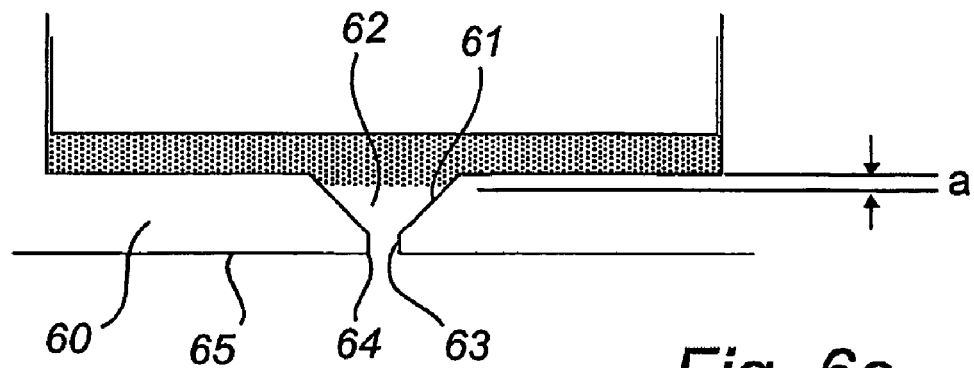
FIGS. 6a-6c illustrate different degrees of solder paste filling according to an embodiment of the method of the present invention.
Figure 6B:
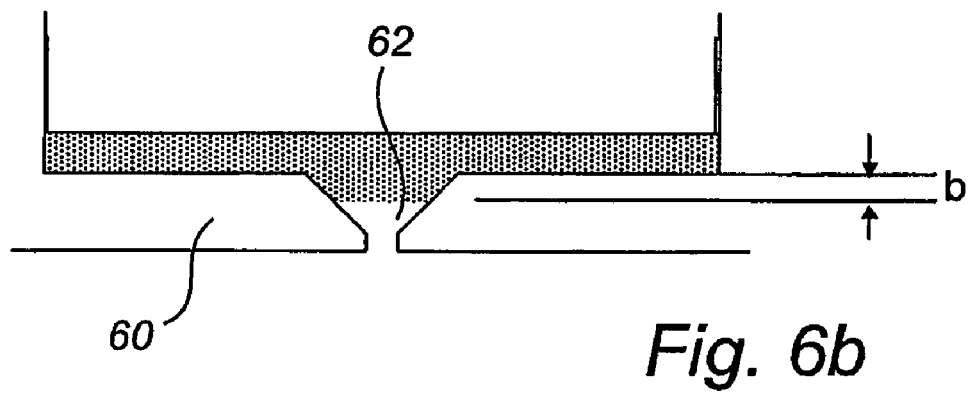
Figure 6C:
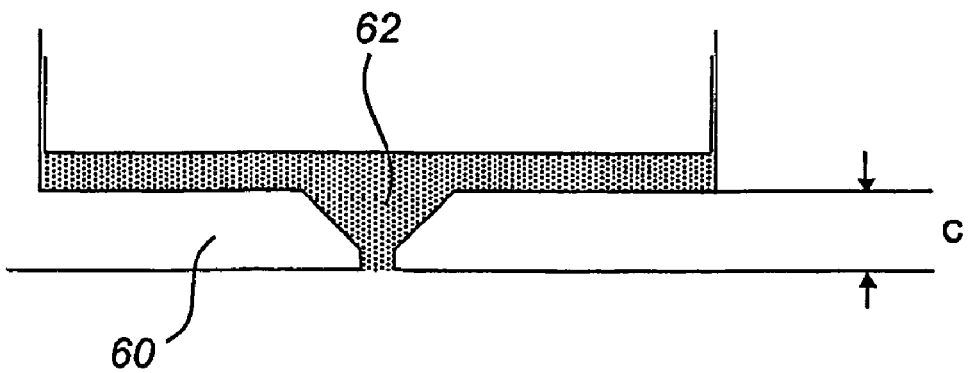

In order to obtain a well controlled and individually adjusted amount of solder paste in each droplet, the degree of filling of the nozzle space 28 before each jetting is set. Different degrees of filling are shown in FIGS. 6*a*-6*c*, which similarly illustrates an alternative embodiment of the nozzle 60, which still comprises a frusto-conical portion 61 that defines most of the nozzle space 62. However, rather than the second frusto-conical portion 93, there is provided a cylindrical portion 63. The upper end of the cylindrical portion 63 coincides with the top end of the frustum of a cone 61, and the lower end of the cylindrical portion 63 is positioned at the bottom surface 65 of the nozzle 60. In this alternative embodiment the nozzle outlet 64 is defined by the lower end of the cylindrical portion 63.

From FIGS. 6*a*-6*c* it is also evident that the nozzle space 62 is filled from the upper portion thereof towards the nozzle outlet 64. Thus, if the nozzle space 62 is filled to a small extent, as shown in FIG. 6*a*, a comparatively small droplet is then jetted, while if the nozzle space is fully filled, as in FIG. 6c, a largest possible droplet is jetted.

Figure 7A:
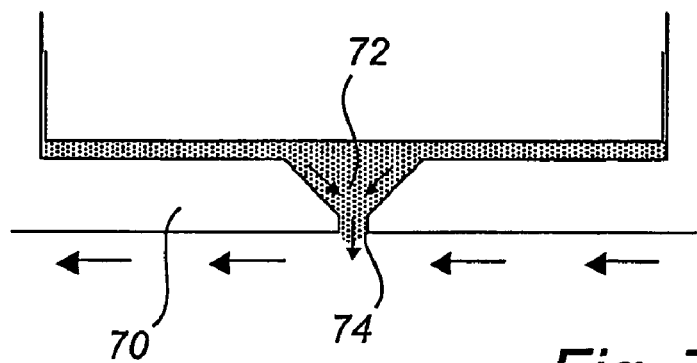
FIGS. 7a and 7b illustrate operation principles according to an embodiment of the method of the present invention.
Figure 7B:
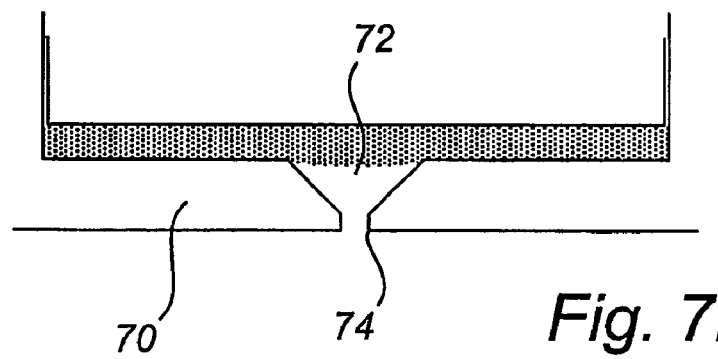

As shown in FIGS. 7a and 7b, before jetting a first droplet after a pause, or at start up of the jetting machine, it is ascertained that the degree of filling of the nozzle space, in these figures denoted 72, is correct. This is achieved by firstly feeding solder paste, by means of the feed screw 32, into the nozzle space 72 to such an extent that it fills the nozzle space 72 completely, as is illustrated in FIG. 7a. In this process, small amounts of solder paste may even be forced out of the nozzle outlet 74. Thanks to the suction function obtained by means of an air flow as described above, excessive solder paste is prevented from falling onto a board located beneath the nozzle 70. The air flow is schematically indicated by the horizontal arrows in FIG. 7a. It is to be noted that for ease of description, the plate downstream of the nozzle outlet has been omitted in FIGS. 7a-7b, as well as in FIGS. 6a-6c. During this process, the plunger 21b is held in an idle position.

Secondly, the volume of the jetting chamber is increased by retracting the plunger 21b, by means of controlling the actuator part 21a. The plunger 21b is retracted and, thereby, the end surface thereof moved a predetermined distance so as to empty the nozzle space 28/72 to an accurately predetermined extent. In the example shown in FIG. 7b, the nozzle space 72 has been almost completely emptied of solder paste. Having now obtained the appropriate degree of filling of the nozzle space 28/72, the jetting device is ready for impacting. The jetting of the droplet should then follow essentially immediately, in order to assure that there is no time for substantive changes in the jetting conditions to occur.

The jetting sequence then begins by feeding solder paste into the nozzle space 28 in accordance with information on what size of droplet that is to be jetted. When the feeding is completed, the actuator is energized so as to obtain an impacting movement of the plunger 21b, which movement rapidly decreases the volume of the jetting chamber 37 to such an extent that the amount of solder paste that is present in the nozzle space 28 is jetted out of the nozzle outlet 27 and onto the board 2. In accordance with this method, it is possible to jet an accurate and predetermined amount of solder paste already when jetting the first droplet after a period of inactivity that has been too long for the jetting conditions at the nozzle for the preceding jetting of a droplet to persist.

Figure 9A:
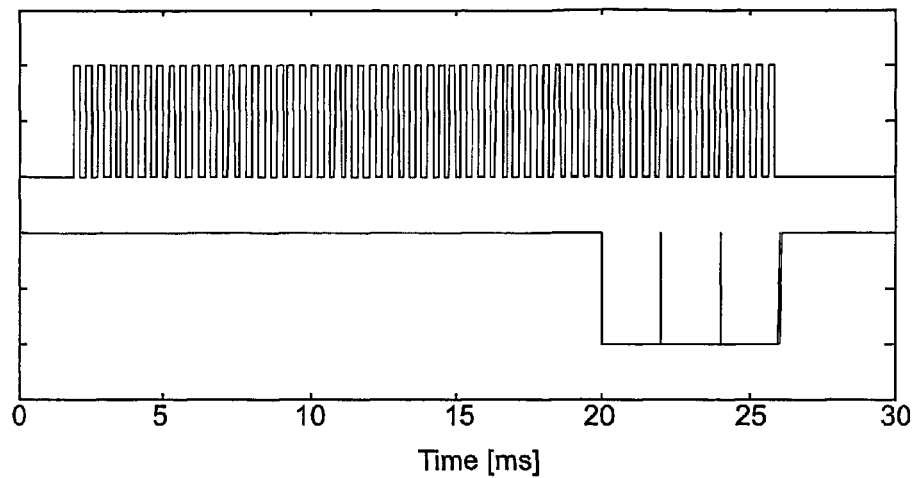
FIGS. 9a and 9b are graphs illustrating drive signals according to an embodiment of the method of the present invention.

Typically, a series of droplets are jetted consecutively. Accordingly, the stepper motor rotating the feed screw 32 is driven with a signal of a predetermined frequency. An example thereof is shown in FIG. 9a, and more specifically the upper curve thereof, where the pulses of a pulse signal are applied to the stepper motor. For each pulse, a known amount of solder paste is fed into the jetting chamber. The lower curve illustrates the control signal that is applied to the actuator. When the control signal is high, the plunger 21b is in the idle position, and when the control signal is low, the plunger is in the ready position.

Figure 9B:
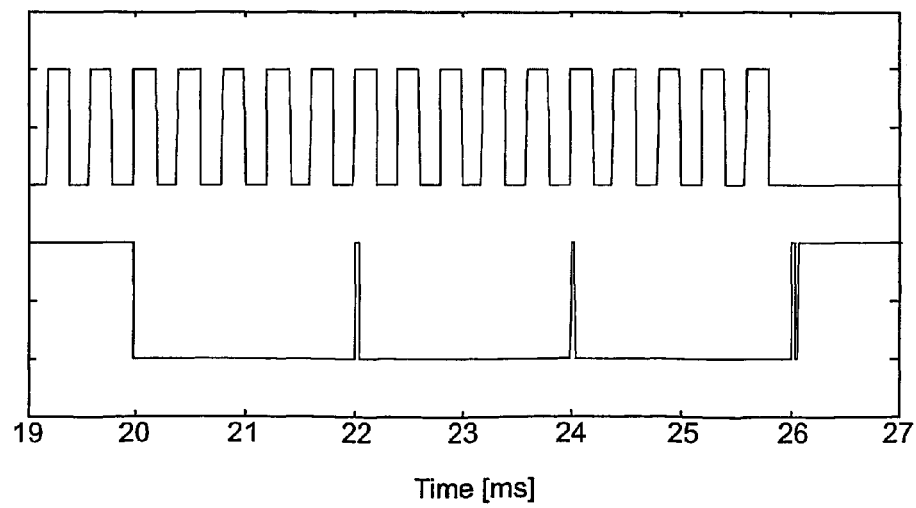

FIG. 9a shows the initialization phase, where the pulse signal is applied to the stepper motor during a selected time period, here about 20 ms before the first droplet is jetted. Firstly, the generation of the pulse signal is started while the plunger 21b is in the idle position. At the time of 20 ms in the graph, the voltage of the actuator control signal is changed so as to cause a retraction of the plunger 21b in order to withdraw solder paste from the nozzle space 28. Now the initialization is finished, and the jetting sequence begins. Thus, a number of pulses, as is more clearly shown in FIG. 9b, are applied to the motor for a duration of about 2 ms before an impacting pulse is applied to the actuator 21a. The impacting pulse brings about a rapid plunger movement towards the nozzle space 28, which causes a droplet to be jetted. The duration of the impacting pulse is very short, which means that the plunger 21b is almost immediately returned to the position where it is ready to perform the jetting of the next droplet. For ease of description, only three jetting pulses have been illustrated in this example.

As can be seen from FIG. 9b, the plunger is moved rapidly to the idle position just after the last droplet has been jetted and the plunger has returned to the ready position. It is to be noted that the rotation of the feed screw is stopped after the jetting of the last droplet in a jetting sequence has been performed, and consequently no further solder paste is fed into the jetting chamber 37. Since no solder paste has been fed into the nozzle space 28 after said jetting of the last droplet, no solder paste will be accidentally jetted when moving the plunger 21b into the idle position. This is one alternative of placing the device in an idle state.

Still, and in accordance with another embodiment of the method according to the present invention, the transition into the idle state is performed slowly in order to further ascertain that no solder paste is unintentionally jetted. In order to exemplify the difference between fast and slow, the fast movement could, for example, have a duration in the order of 10 microseconds, while the slow movement could have a duration in the order of a few milliseconds.

According to yet another embodiment, the plunger 21b is not retracted to the ready position after said jetting of the last droplet has been performed, and before being relocated to the idle position. Instead, the plunger 21b is immediately moved into the idle position after said jetting of the last droplet.

The time period during which the feed screw is rotated prior to the retraction of the plunger 21b from the idle position, i.e. before jetting a first droplet in a jetting sequence, should not be excessive in order to minimize the amount of solder paste that is forced through the nozzle outlet 27. Ideally, there is no residue at all. On the other hand, said time period is variable and is determined as a function of the chosen feeding rate, i.e. the pulse frequency of the drive signal applied to the stepper motor, and the feeding pressure. By feeding pressure is meant the pressure at the outlet port 36. The feeding pressure is in turn related to the feeding rate. What is determinative for the feeding rate/pressure is the desired jetting frequency and the size of the droplets in the jetting sequence to follow after the period of the idle state. The jetting frequency is adjustable as well.

Figure 10A:
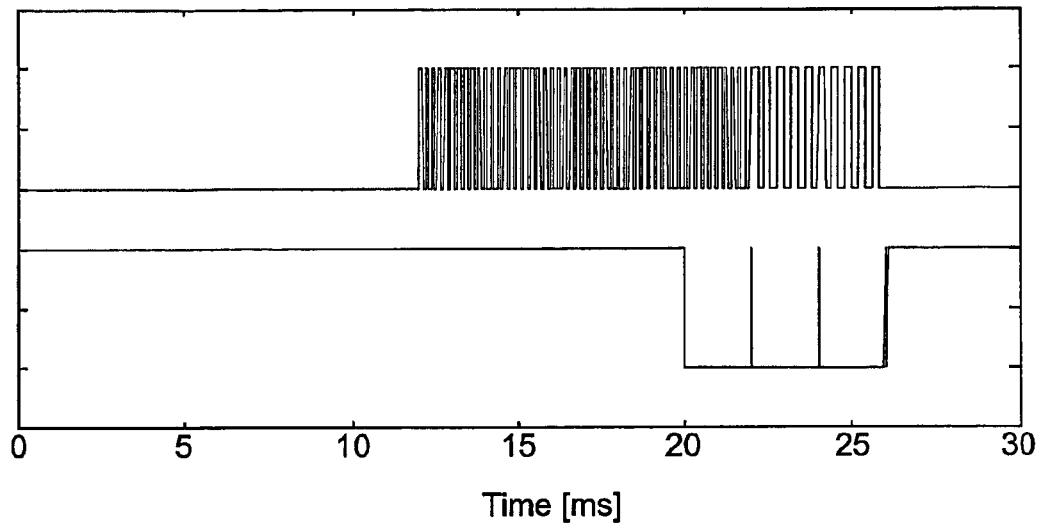
FIGS. 10a and 10b are graphs illustrating drive signals according to another embodiment of the method of the present invention.
Figure 10B:
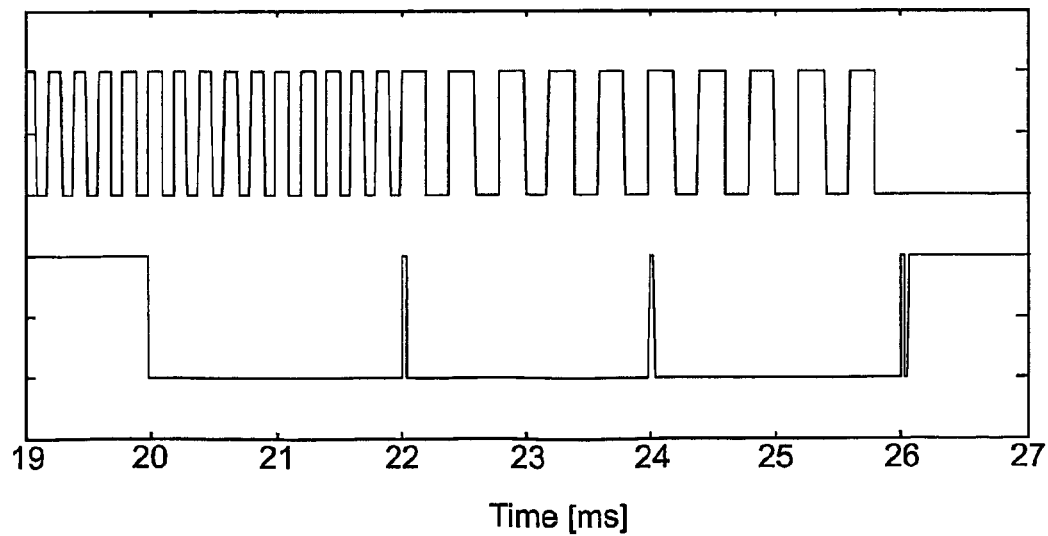

In a further example of the invention, as is illustrated in FIGS. 10a and 10b, the feeding rate prior to jetting of the first droplet in a jetting sequence, is different from the feeding rate during the jetting sequence. In the example shown, the pulse frequency of the drive signal applied to the stepper motor rotating the feed screw is higher prior to the jetting of the first droplet than during the ensuing jetting sequence. Thereby, the time required to obtain the desired and predetermined feeding pressure is reduced.

Even though the present invention has been described above using exemplifying embodiments thereof, alterations, modifications, and combinations thereof, as understood by those skilled in the art, may be made without departing from the scope of the invention, which is defined in the accompanying claims.

The invention claimed is:

1. A method of jetting droplets of viscous medium onto a substrate, the method comprising the steps of:
    providing a jetting nozzle comprising a nozzle space and a nozzle outlet;
    feeding said viscous medium into the nozzle space;
    impacting said viscous medium with an impact mechanism, thereby jetting viscous medium from the nozzle space in the form of droplets through the nozzle outlet towards the substrate; and
    varying a volume of a droplet of the viscous medium independent of a stroke length of the impact mechanism,
    wherein the step of feeding comprises:
    prior to each step of impacting to jet each individual droplet, filling the nozzle space with said viscous medium to a varying degree to adjust the volume of the viscous medium in the nozzle space, the degree being adjusted in dependence on the volume of the droplet to be jetted after each step of impacting.

2. The method as claimed in claim 1, wherein said step of feeding comprises:
    regulating the rate of feeding of viscous medium into the nozzle space within a jetting sequence such that the nozzle space is filled to a predetermined degree during the time period between the jetting of successive droplets within said jetting sequence.

3. The method as claimed in claim 1, further comprising the step of filling the nozzle space from the end opposite the nozzle outlet towards the end at the nozzle outlet, such that a portion of the nozzle space located closest to the nozzle outlet is free of viscous medium when the nozzle space is partially filled with an amount of viscous medium corresponding to a desired droplet volume.

4. The method as claimed in claim 1, further comprising the steps of:
    pausing the jetting operation,
    filling, during said pause and prior to jetting of the first droplet to be jetted after said pause, the nozzle space with viscous medium; and
    reducing, prior to said jetting of the first droplet, the amount of viscous medium in the nozzle space to a preset degree.

5. The method as claimed in claim 4, further comprising the steps of:
    providing a chamber for containing viscous medium, said chamber being located upstream of the nozzle space as seen in the feeding direction; and
    providing said reduction of viscous medium in the nozzle space by increasing the volume of said chamber, such that a preset amount of viscous medium located in the nozzle space is retracted into said chamber.

6. The method as claimed in claim 5, further comprising the steps of:
    providing an impact end surface constituting a wall of said chamber, said wall being located opposite the nozzle space;
    when pausing, moving said impact end surface into an idle position; and
    providing said increase of the volume of said chamber by moving said impact end surface, in a direction away from the nozzle space, from said idle position into a position ready for impacting.

7. The method as claimed in claim 6, further comprising the step of performing said moving of the impact end surface into the idle position, such that no unintentional jetting of viscous medium is produced.

8. The method as claimed in claim 4, wherein said filling during said pause comprises:
    filling said nozzle space by activating a feeder for feeding viscous medium a predetermined time prior to said jetting of the first droplet.

9. The method as claimed in claim 8, wherein said filling during said pause comprises the step of:
    controlling the feeding operation and selecting said predetermined time such that a predetermined feeding pressure is obtained at an outlet end of said feeder prior to said jetting of the first droplet.

10. The method as claimed in claim 9, wherein said step of controlling and selecting comprises the step of:
    controlling the feeding operation and selecting said predetermined time such that a flow of excess viscous medium out of the nozzle outlet, as a result of said filling of the nozzle space with viscous medium during said pause, is reduced to a preset degree.

11. The method as claimed in claim 9, wherein said step of controlling the feeding operation comprises the step of:
    controlling the feeding rate during said pause prior to said jetting of the first droplet, such that a predetermined feeding pressure is obtained at an outlet end of said feeder prior to said jetting of the first droplet.

12. The method as claimed in claim 11, further comprising the step of controlling the feeding rate such that it is higher prior to said jetting of the first droplet than during the ensuing jetting sequence.

13. The method as claimed in claim 9, wherein said filling during said pause comprises the step of:
    selecting said predetermined feeding pressure in adaptation to a desired jetting frequency and a desired droplet volume of a jetting sequence following said pause.

14. The method as claimed in claim 4, further comprising the step of removing viscous medium residue from the nozzle outlet, wherein said removing comprises removing excess viscous medium flowing out of the nozzle outlet as a result of said filling of the nozzle space with viscous medium during said pause.

15. The method as claimed in claim 1, further comprising the step of removing viscous medium residue from the nozzle outlet.

16. The method as claimed in claim 15 or 14, wherein said removing further comprises the step of providing a gaseous flow past the nozzle outlet such that the gaseous flow carries said viscous medium residue and excess viscous medium away from the nozzle outlet.

17. The method as claimed in claim 16, wherein said step of removing further comprises the step of providing a suction generator for producing said gaseous flow.

18. The method as claimed in claim 1, further comprising the step of regulating the feeding operation of said feeder.

19. The method as claimed in claim 18, wherein said regulation of the feeding operation further comprises the step of regulating the feeding rate of said feeder, such that the time for said feeding of said viscous medium into the nozzle space is substantially constant, regardless of the desired droplet volume.

20. The method as claimed in claim 18, wherein said regulation of the feeding operation further comprises the step of regulating the duration of the feeding prior to the jetting of each individual droplet.

21. The method as claimed in claim 1, further comprising the step of using a feed screw for said feeding of viscous medium.

22. The method as claimed in claim 1, wherein said impacting further comprises the step of regulating the impacting characteristics such that a desired exit velocity of each jetted droplet is obtained.

23. The method as claimed in claim 22, wherein said regulating of said impacting characteristics further comprises the step of regulating said impacting characteristics such that a predetermined exit velocity is maintained irrespective of the volume of the droplet to be jetted.

24. The method as claimed in claim 23, wherein said regulating of said impacting characteristics further comprises the step of increasing the impact velocity for jetting a droplet of a smaller volume and decreasing the impact velocity for jetting a droplet of larger volume, such that said predetermined exit velocity is maintained.

* * * * *